United States Patent
Mei et al.

(10) Patent No.: US 6,300,648 B1
(45) Date of Patent: Oct. 9, 2001

(54) CONTINUOUS AMORPHOUS SILICON LAYER SENSORS USING SEALED METAL BACK CONTACT

(75) Inventors: Ping Mei, Palo Alto; Jeng Ping Lu, Mountain View; Francesco Lemmi, Menlo Park; Robert A. Street, Palo Alto; James B. Boyce, Los Altos, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/473,579

(22) Filed: Dec. 28, 1999

(51) Int. Cl.[7] ............................ H01L 29/04; H01L 31/20; H01L 31/036; H01L 31/0376
(52) U.S. Cl. ...................... 257/59; 257/61; 257/292; 257/350; 257/458; 257/656
(58) Field of Search ........................... 257/59, 61, 72, 257/292, 350, 458, 656

(56) References Cited

U.S. PATENT DOCUMENTS 5,682,037 * 10/1997 De Cesare et al. .................. 250/372
6,034,725 * 3/2000 Franklin et al. ..................... 348/310

* cited by examiner

Primary Examiner—Ngân V. Ngô

(57) ABSTRACT

A method and apparatus for reducing vertical leakage current in a high fill factor sensor array is described. Reduction of vertical leakage current is achieved by eliminating Schottky junction interfaces that occur between metal back contacts and intrinsic amorphous silicon layers. One method of eliminating the Schottky junction uses an extra wide region of N doped amorphous silicon to serve as a buffer between the metal back contact and the intrinsic amorphous silicon layer. Another method of eliminating the Schottky junction completely replaces the metal back contact and the N doped amorphous silicon layer with a substitute material such as N doped poly-silicon.

5 Claims, 6 Drawing Sheets

FIG. 5
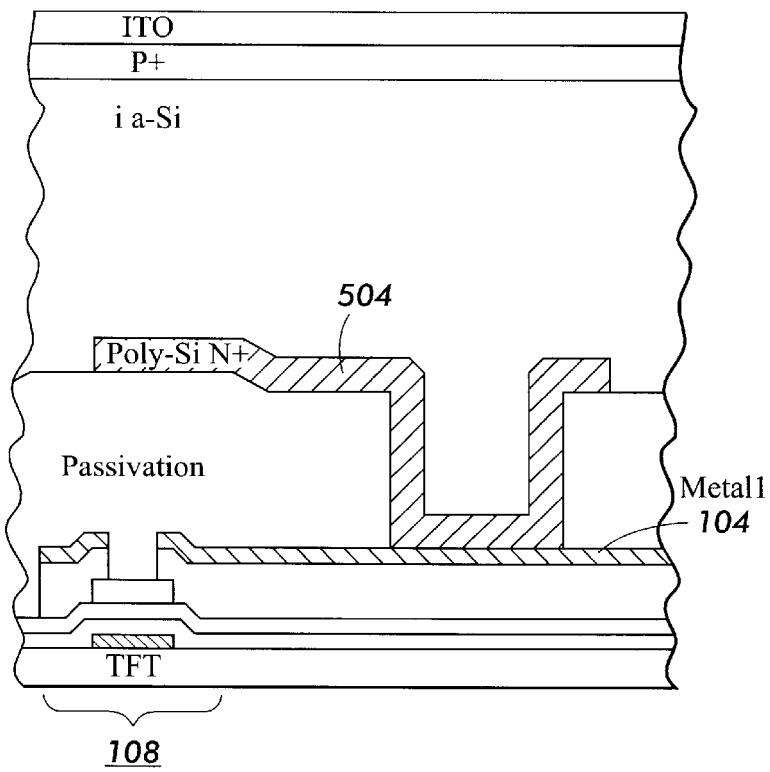
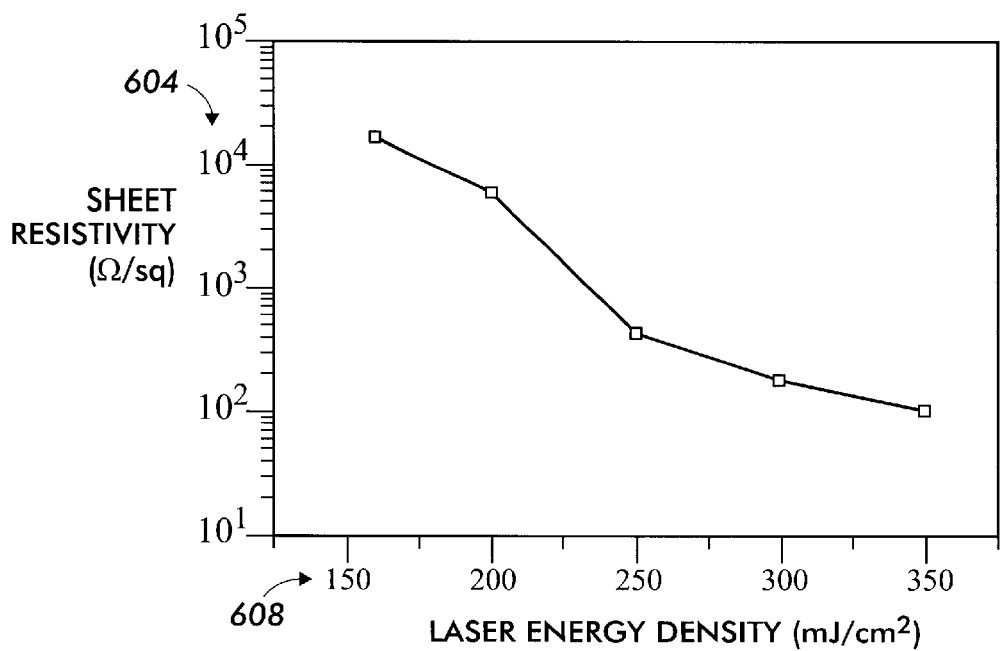
FIG. 6

CONTINUOUS AMORPHOUS SILICON LAYER SENSORS USING SEALED METAL BACK CONTACT

FIELD OF THE INVENTION

The present invention relates generally to the structure of a high fill factor image array with a continuous sensor layer and its method of manufacture. More particularly, the present invention describes a high fill factor image array that reduces vertical leakage current by reducing contact injection current.

BACKGROUND OF THE INVENTION

A conventional image sensor array is typically formed from a plurality of photosensitive elements or pixels arranged in rows or columns. FIG. 8 illustrates an example of a typical PIN (P+/Intrinsic/N+ layered) photosensitive element 10 used in the image sensor array.

Each photosensitive element 10 includes a contact pad 14 positioned over a substrate 11. A photosensor island 12 of doped amorphous silicon (a-Si), includes a P+ doped region 24 and an N+ doped region 22 that covers contact pad 14. Photons that enter photosensor island 12 generate electrons in the a-Si. An applied voltage generates an electric field between transparent upper conductive layer 16 of indium tin oxide (ITO) and contact pad 14. The electric field moves the generated electrons to contact pad 14. Passivation layer 18 separates transparent upper conductive layer 16 from substrate 11 except where the ITO contacts an upper surface of phosphor island 12. Passivation layer 18 typically includes an oxynitride layer 26 and a polyamide layer 28.

Conventional image arrays that use the photosensor element illustrated in FIG. 8 include spaces between adjacent elements. These spaces do not detect light. A ratio of element areas that detect light to space areas occupied by the pixel is defined as a pixel fill factor. Method's of defining fill factor are described in an article entitled "High Efficiency X-Ray Imaging Using Amorphous Silicon Flat-Panel Arrays" by J. Rahn, F. Lemmi, J. P. Lu, P. Mei, R. B. Apte, and R. A. Street published in IEEE Trans. Nucl. Sci. (USA), IEEE Transactions on Nuclear Science (June 1999) vol.46, no.3, pt.2 p. 457–61 and hereby incorporated by reference.

High fill factor image arrays greatly improve the pixel fill factor such that an increased area of the sensor array detects light. FIG. 9 illustrates a high fill factor image array 40 that uses a continuous P+ doped amorphous silicon layer 52 deposited over a continuous intrinsic amorphous silicon layer 50. The continuous layers allow light detection across the entire sensor surface.

A voltage difference between upper electrode 54 and a plurality of source-drain metal contacts 44 on substrate 42 creates an electric field through amorphous silicon layers 50. Upper electrode 54 is typically made of a transparent ITO while source-metal drain contacts 44 are made of an electrically conductive material such as a tri-layer TiW/Al/Cr. The electric field moves the generated electrons to contacts 44. Each contact communicates with switching and processing circuits (not shown) that generate an image based on the charge on each contact.

Patterned back contact collection electrodes 46 coupled to each source-drain contact 44 increases the area of electron collection. An N+ doped amorphous silicon layer 48 is deposited over each source-drain contact 44 to form a PIN structure with continuous layers 50, 52. A conventional passivation layer, typically an approximately one micron thick oxynitride layer, serves as an insulator between adjacent mushroom electrodes.

One problem with conventional image arrays are leakage currents that arise due to material defects. Leakage currents include lateral leakage current between adjacent mushroom contacts and vertical or intrinsic leakage currents that occur along the direction of arrow 58. Lateral leakage currents reduce image resolution. A typical 60×60 square micrometer of PIN sensor may include up to 0.3 pico-amps (pA) of lateral leakage current. A system for minimizing lateral leakage current is described in a patent application entitled Dual Dielectric Structure for Suppressing Lateral Leakage Current in High Fill Factor Arrays by Jeng Ping Lu, Ping Mei, Francesco Lemmi, Robert Street and James Boyce, Ser. No. (D/99215) 09/419,293 hereby incorporated by reference. a system for minimizing lateral leakage current is described in a patent application entitled dual dielectric structure for suppressing lateral leakage current in high fill factor arrays by jeng ping lu, ping mei, francesco lemmi, robert street and james boyce, Ser. No. 09/419,293, hereby incorporated by reference.

Vertical leakage current also degrades image quality by introducing noise. The introduced noise reduces image contrast and/or gray scale. A typical 60×60 square micrometer of a PIN sensor may include about 20 femto-amps (fA) of intrinsic leakage current at five volt contact voltages.

Thus a method and apparatus for reducing vertical leakage current is needed.

SUMMARY OF THE INVENTION

One problem with high fill factor image arrays is that vertical leakage currents reduce image contrast thereby degrading the quality of images output. One source of vertical leakage current is a contact injection current that results when a metal comes in contact with intrinsic amorphous silicon.

During fabrication of a typical back contact, a single mask is used to form both the metal back contact and an N+ doped amorphous silicon layer over the metal contact. However, the use of a single mask for both the N+ doped amorphous silicon layer and the metal back contact results in an edge of the metal being exposed to the intrinsic amorphous silicon. Despite the small size of the exposed area, it has been found that under certain reverse bias conditions, the area is sufficient to generate a large amount of vertical leakage current. In order to avoid vertical leakage current, one embodiment of the invention uses a second mask to generate a wider N+ amorphous silicon layer that seals in the metal portion of the back contact and prevents all direct contact between the intrinsic amorphous silicon layer and the metal back contact. An alternative embodiment of the invention replaces both the metal back contact and the N+ amorphous silicon layer with a single alternative material such as an N+ doped poly-silicon contact. Still a third embodiment of the invention retains the N+ amorphous silicon layer and replaces only the metal back contact with another conducting material that does not generate significant injection current when brought into contact with intrinsic amorphous silicon.

BRIEF DESCRIPTION OF THE DRAWINGS

A more complete appreciation of the invention will be more readily obtained and understood by referring to the following detailed description and the accompanying drawings.

FIG. 5 is a schematic cross sectional view of a full fill factor sensor in which the N+ amorphous silicon layer and the metal back contact has been replaced with a single N+ doped poly-silicon layer.

FIG. 6 is a graph that shows the change in sheet resistivity of a section of N doped amorphous silicon as a function of laser exposure.

DETAILED DESCRIPTION OF THE INVENTION

Figure 1:
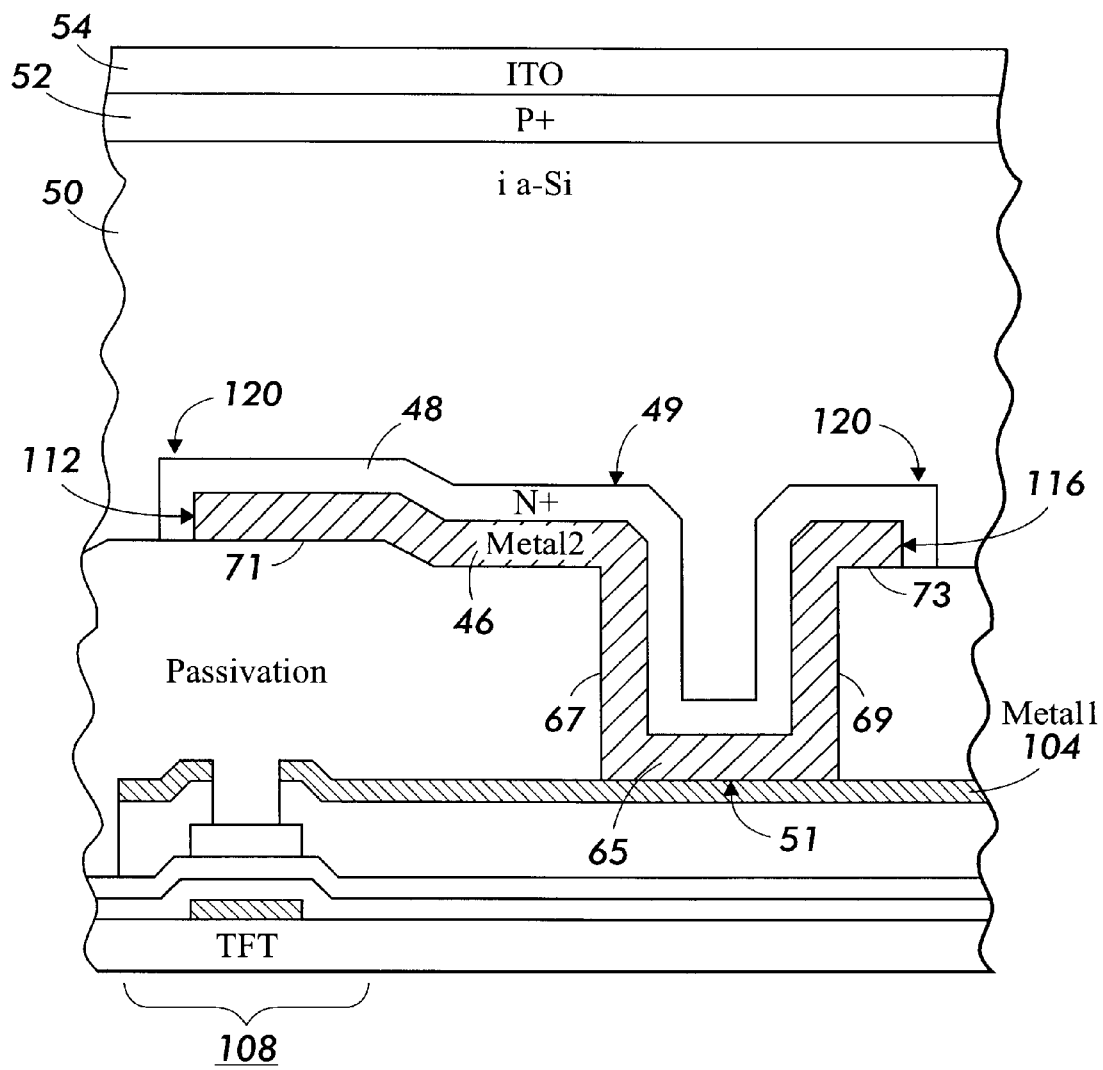
FIG. 1 is a schematic cross sectional view of a high fill factor sensor in which the N doped amorphous silicon layer

FIG. 1 shows a sensor structure in which an N+ doped amorphous silicon layer completely eliminates contact between a metal back contact and an intrinsic amorphous silicon layer. As used herein, a "back contact" is defined as a sensor contact that is designed to increase charge collection from a sensor medium, such as amorphous silicon, by increasing the surface area of a charge collecting surface. Typically such back contacts are "mushroom shaped" to provided a larger surface area on a side exposed to the sensor medium and a smaller contact point surface area that couples the collected charge to detection electronics. A center portion of the mushroom shape typically forms a "U" with the bottom of the "U" forming the contact point and extensions from the top of the "U" providing additional surface area to collect charge. The extensions are typically oriented perpendicular to the top of the "U" and parallel to the collection surface. Such a structure will be illustrated and described further in FIG. 1.

In FIG. 1, a P+ doped amorphous silicon layer 52, an intrinsic silicon layer 50, and an N+ doped amorphous silicon layer 48 together form a PIN structure. A transparent conducting ITO upper layer 54 and a metal back contact 46 bias the PIN structure. Photons pass through the transparent conducting ITO layer and generate free electrons and holes in the intrinsic amorphous silicon layer 50. The voltage applied to the contacts generates an electric field that moves the electrons to metal back contact 46. In the illustrated embodiment, metal back contact 46 is mushroom shaped to from a metal mushroom contact.

As used herein, a mushroom shaped contact typically includes a "U" shaped portion including a conducting bottom segment 65 and two conducting upright segments 67, 69. A first end of each upright segment 67, 69 is coupled to corresponding ends of bottom segment 65. Each upright segment 67, 69 is oriented approximately perpendicular to bottom segment 65. A second end of each upright conducting segment 67, 69 is coupled to an end of a corresponding conducting extension segment 71, 73. Each, extension segment 71, 73 is oriented approximately parallel to bottom segment 65 and approximately perpendicular to upright conducting segments 67, 69.

As described, each mushroom contact includes a larger charge collection surface 49 created by extension segments 71, 73. Charge collection surface 49 receives charge from the sensor medium. A contact point 51 transfers the collected charge from the mushroom contact to underlying electronics via line 104. Line 104 couples the charge to support or readout electronics. In the illustrated embodiment, line 104 is a data line that couples to a gate of a thin film transistor TFT transistor 108.

TFT transistor 108 may be formed using a number of different methods. One method of integrating the sensor with detection or imaging electronics that include TFT transistor 108 is to form the TFT transistor from a Complimentary Metal Oxide Structure (CMOS) and to form the sensor medium including the amorphous silicon layer 50 directly over the CMOS electronics. A reference that describes the formation of a CMOS structure for use in a sensor is "Image Sensors in TFA Technology- Status and Future Trends" by Bohm, M. et al. presented on Pages 327–338 of the conference paper of the Amorphous and Microcrystalline Silicon Technology 1998 Symposium held in San Francisco on Apr. 14–17, 1988.

Formation of the mushroom structure in prior art metal mushroom contacts was convenient because a single mask is used for forming the metal back contact 46 and the doped N+ layer 48. However, formation using a single mask leaves edges 112, 116 of metal back contact 46 in direct contact with the intrinsic amorphous silicon layer. Under reverse bias conditions, a leakage current resulting from contact injection would occur at the interface of the intrinsic amorphous silicon layer and the edges 112, 116 of metal back contact 46. The amount of leakage current depends on an injection barrier height and the electric field from the applied bias voltage. A discussion of the reasons for the leakage current and factors that affect the leakage current will be provided with the discussion accompanying FIG. 2, FIG. 3 and FIG. 4.

To reduce the vertical leakage current, one embodiment of the invention uses a first mask to form the metal back contact and a second mask to form the N+ amorphous silicon layer. The area of the N+ amorphous silicon layer is slightly larger than the area of the metal back contact to create an overhang area 120 of N+ amorphous silicon that covers the edges 112, 116 of metal back contact 46. The overhang area 120 eliminates the direct contact between metal and intrinsic amorphous silicon by sealing off metal portions of the back contact from the intrinsic amorphous silicon.

Figure 2:
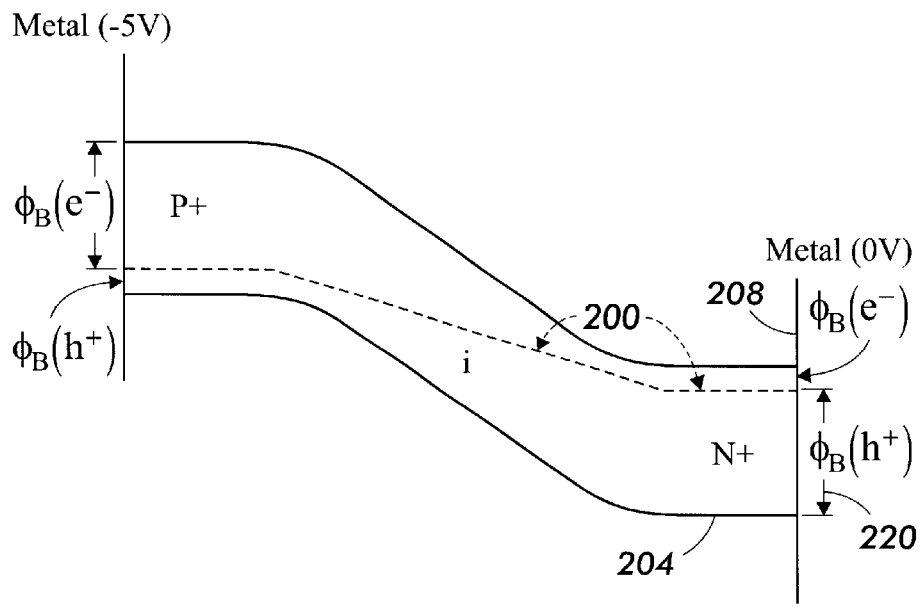
FIG. 2 is an energy band diagram showing the Fermi level across a p-i-n doped amorphous silicon and metal interface.
Figure 3:
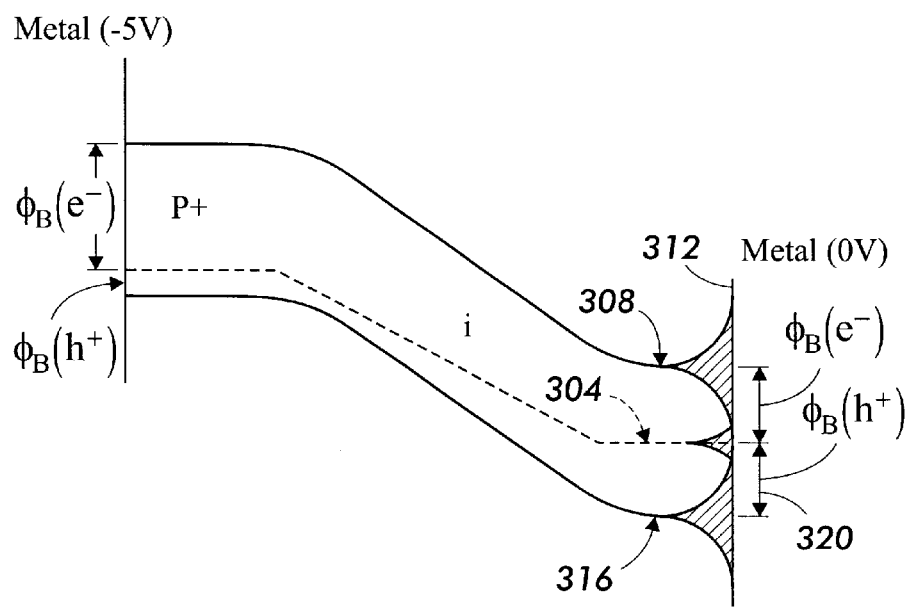
FIG. 3 is an energy band diagram showing the Fermi level across a p-i amorphous silicon and metal interface.

To understand the advantage of eliminating the Schottky contact, FIG. 2 illustrates the Fermi level of a reverse biased PIN amorphous silicon to metal interface while FIG. 3 illustrates the Fermi level of a PI amorphous silicon to metal Schottky interface. In a PIN amorphous silicon sensor, a dark reverse-bias current results from 1) bulk generation, 2) contact injection and 3) edge leakage. The contact injection portion of the dark reverse bias current arises from carrier injection across a junction barrier between a metal electrode and the amorphous silicon. The contact injection current may be expressed as $I=I_{init} \exp(-q\Phi/kT)$ where $\Phi$ is the junction barrier height, k is boltzmann's constant, T is temperature, $I_{init}$ is a current pre-factor, and q is electronic charge.

As illustrated in FIG. 2, when the doping in the N+ layer is very high and the PIN diode is reversed-biased, the energy band profile or Fermi level 200 is relatively flat. The barrier height 220 for hole generation, $\Phi$ is the potential difference near interface 208 between a Fermi level 200 in the N+ layer and the valence band 204 in the N+ layer. The relatively large value of $\Phi$ results in a relatively small injection current due to the $I=I_{init} \exp(-q \Phi/kT)$ relationship.

FIG. 3 illustrates a Schottky diode in which an intrinsic amorphous silicon contacts a metal. In a Schottky diode, the Fermi level 304 in the intrinsic amorphous silicon layer spreads slightly but is typically pinned at a center of bandgap 308 near the silicon to metal interface 312. The junction barrier height for hole generation, Φ is the potential difference between Fermi level 304 and valence band 316 near the silicon to metal interface 312. FIG. 3, and FIG. 2 together illustrate that the Schottky diode barrier height 320 is significantly smaller than the barrier height 220 when a heavily doped N+ layer interfaces with a metal. The smaller barrier height results in a larger injection current.

Figure 4:
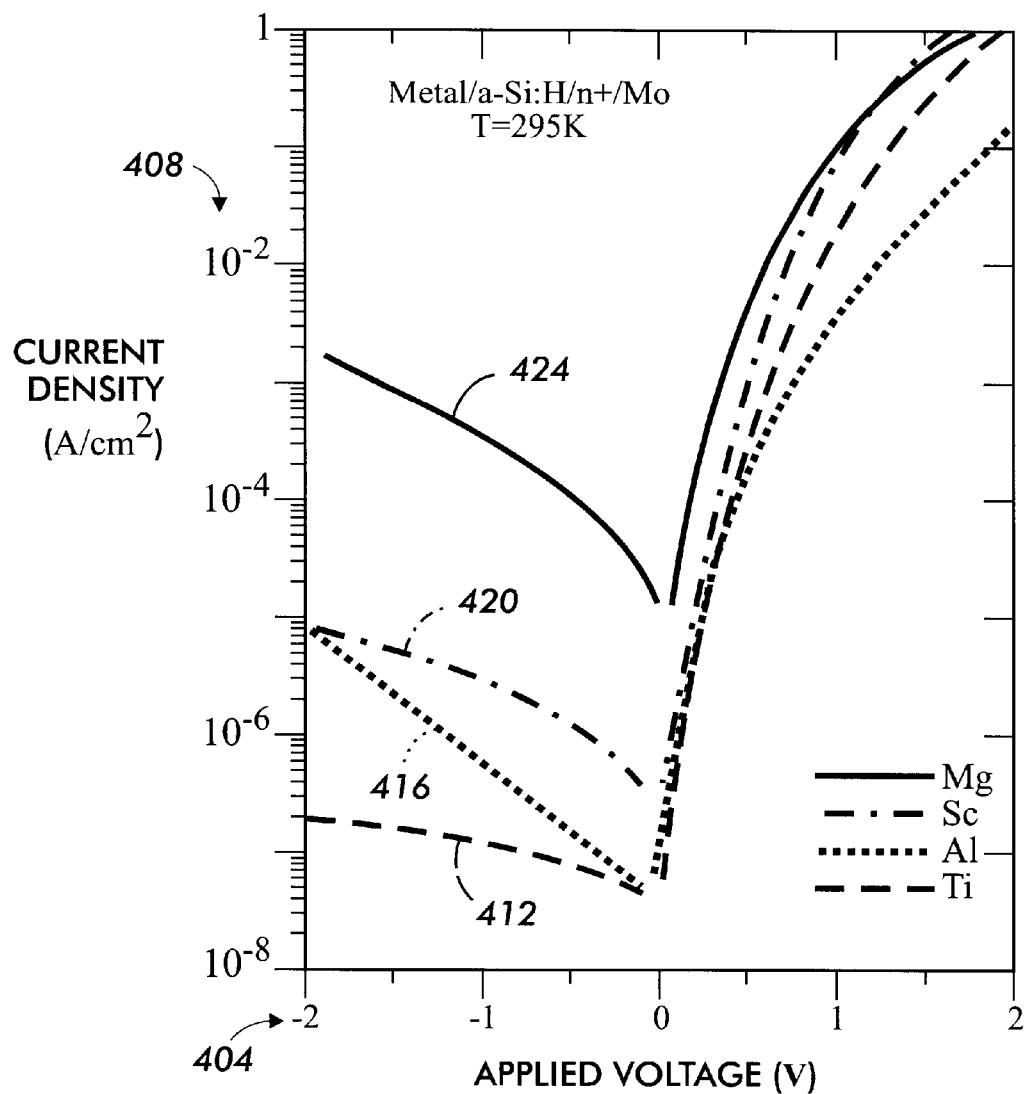
FIG. 4 is a graph that shows the contact injection current as a function of voltages applied across a Schottky junction.

FIG. 4 plots the injection current density in a Schottky diode as a function of an applied bias voltage. The current density is plotted along vertical axis 408 and the bias voltage is plotted along horizontal axis 404. Each curve 412, 416, 420, 424 plots the current density versus bias voltage characteristic for a different type of metal.

To avoid edge contact injection current and still fabricate a mushroom contact, the metal can be removed in FIG. 1 leaving only the N+ amorphous layer deposited in a mushroom form. However, the sheet resistance of N doped amorphous silicon is high, typically on the order of 6 MegaOhms per square. The high sheet resistance slows down read-out time.

In order to maintain a reasonable read-out time, FIG. 5 illustrates one embodiment of the invention in which both the metal back contact 46 and the N doped silicon layer 48 of FIG. 1 are replaced by a single N doped poly-silicon back contact 504. The poly-silicon back contact 504 serves as a good conductor to collect and transport charge to line 104. The N doping of poly-silicon back contact 504 also provides the desired PIN structure. As illustrated, the poly-silicon back contact 504 also maintains a mushroom shape.

Various methods may be used to form a doped poly-silicon back contact. One method of formation includes depositing an N doped amorphous silicon layer in a mushroom configuration. Laser Crystallization converts the N doped amorphous silicon layer into an N doped poly-silicon layer. To protect TFT 108 and metal line 104 during laser crystallization, a selective laser process may be used that does not completely melt the N doped amorphous silicon. Complete melting of the amorphous silicon is not needed to achieve the low resistance desired as will be illustrated in the graph of FIG. 6. Passivation layer 56 also serves as a buffering layer further protecting TFT 108.

FIG. 6 is a graph that shows the change in sheet resistivity of a 100 nanometer section of amorphous silicon doped with phosphor atoms as a function of laser exposure. Sheet resistivity is plotted along vertical axis 604 while laser energy density is plotted along horizontal axis 608. As illustrated in FIG. 6, moderate laser energies of around 200 mJ/cm$^2$ are sufficient to achieve sheet resistances below one KiloOhm per square.

A second method of forming a doped poly-silicon back contact includes depositing intrinsic amorphous silicon. Ion implantation or laser doping is used to deposit N+ ions in the intrinsic amorphous silicon. A laser anneal after the ion implantation or laser doping converts the amorphous silicon into poly-silicon. Poly-silicon back contact 504 may be exposed to several minutes of plasma hydrogenation prior to deposition of intrinsic amorphous silicon to assure a high quality n-i junction 508 between the poly-silicon and the intrinsic amorphous silicon.

Alternate materials besides poly-Silicon may be used to replace the combination of metal back contact 46 and N+ doped amorphous silicon layer 48 of FIG. 1. One example of such a material is doped microcrystalline Silicon. A PECVD ( Plasma Enhance Chemical Vapor Deposition) process may be used to deposit the doped miro-crystalline silicon with hydrogen dilute silane and phosphine. Another suitable material is doped poly-SiC (poly-silicon carbide).

One benefit of using poly-SiC is that the wide energy band gap of the poly-SiC provides a high potential barrier that reduces hole injection and minimizes contact current.

Figure 7:
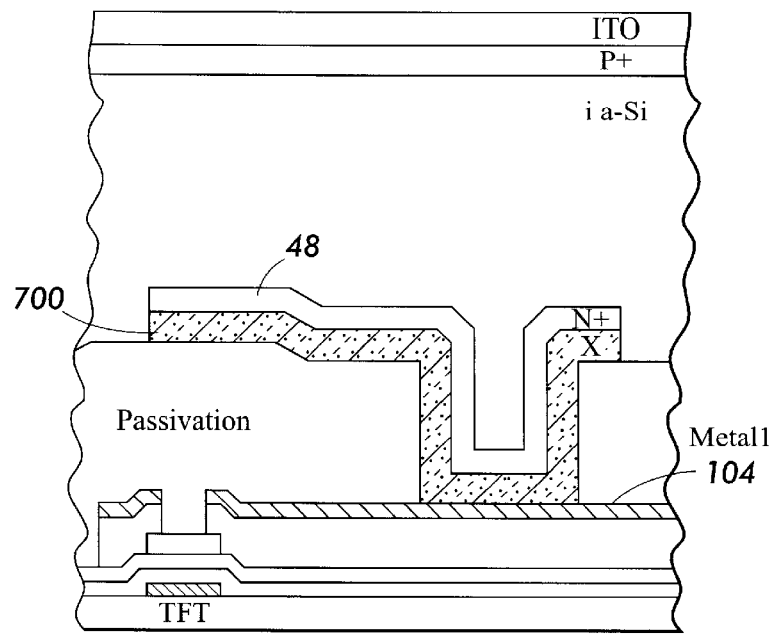
FIG. 7 is a schematic cross sectional view of a full fill factor sensor in which the N+ amorphous silicon layer is retained, but the metal back contact is replaced with a non-metal film.
Figure 8:
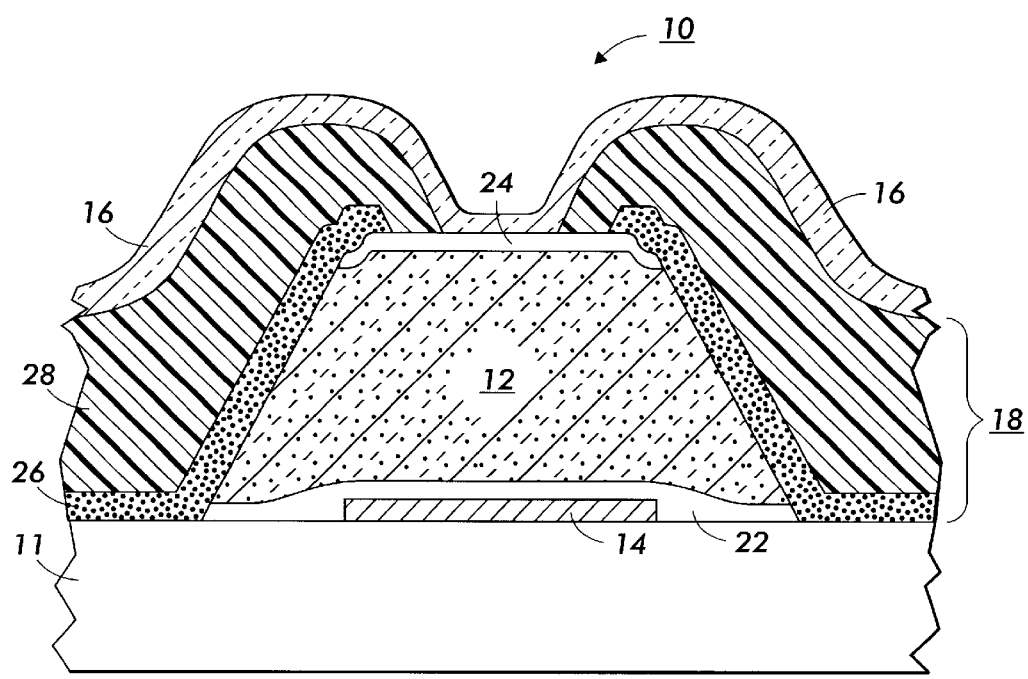
FIG. 8 is a schematic cross sectional view of a prior art PIN photosensitive element.
Figure 9:
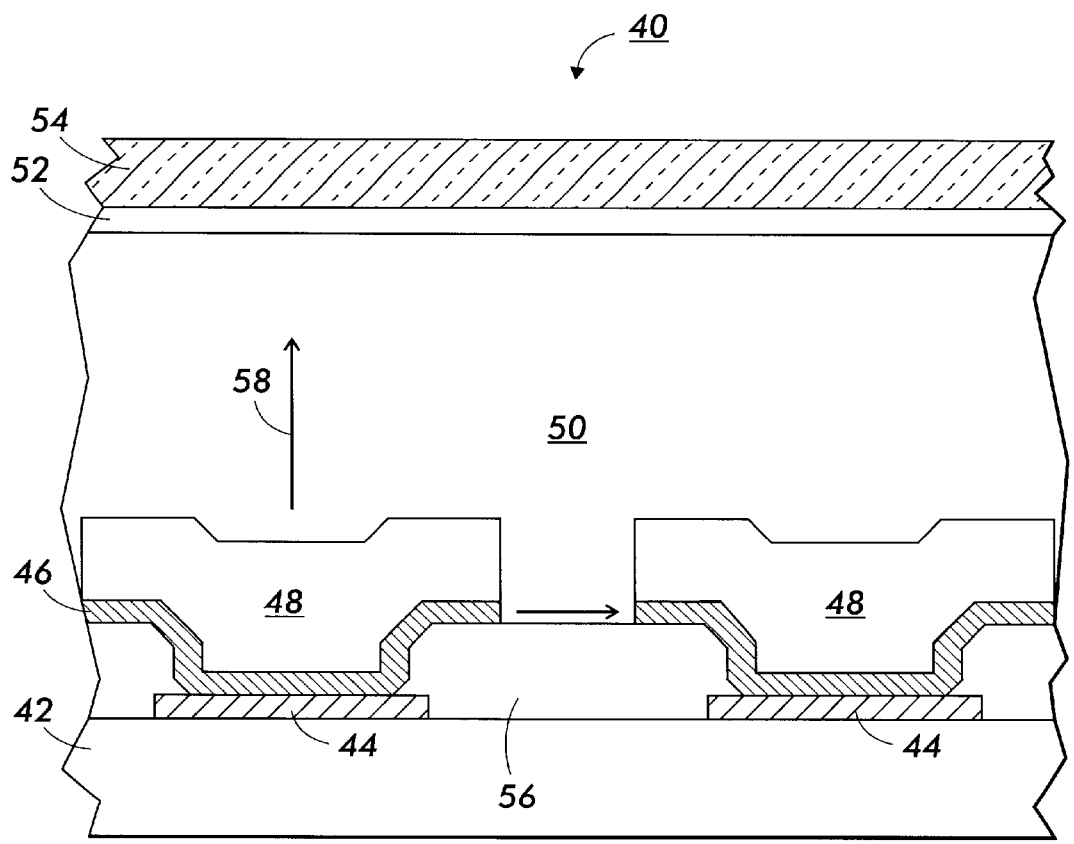
FIG. 9 is a schematic cross sectional view of a prior art full fill factor sensor array.

FIG. 7 illustrates an alternate embodiment of the invention that continues to utilize two layers for a mushroom contact, including the N+ amorphous silicon layer 48 of FIG. 1. In FIG. 7, only metal mushroom contact 112 is replaced with a substitute material 700. Suitable substitute materials should be a semiconductor conductor with a low sheet resistance (lower than 100 kilo Ohms per square) which allows direct contact with the intrinsic amorphous silicon layer without generating large amounts of contact current. Suitable substitute materials include doped poly-silicon, doped SiC, doped SiGe and doped Ge films. The dual structure of an N+ layer and a substitute material maintains the nature of an amorphous silicon PIN junction while utilizing the substitute material to conduct charge and minimize contact injection current. Because some contact with the intrinsic amorphous silicon is allowed, a single mask is used in the fabrication of both the N doped amorphous silicon layer and the substitute material of the back contact While the invention has been described in terms of a number of specific embodiments, it will be evident to those skilled in the art that many alternatives, modifications, and variations are within the scope of the teachings contained herein. For example, variations in dopant materials used to replace a metal mushroom contact and variations in laser power used to convert amorphous silicon to poly-silicon are possible. Accordingly, the present invention should not be limited by the embodiment used, to exemplify it, but rather should be considered to be within the spirit and scope of the following claims, and equivalents thereto, including all such alternatives, modifications, and variations.

What is claimed is:

1. A sensor comprising:

an intrinsic amorphous silicon layer;

a transparent first electrode coupled to a first side of the intrinsic amorphous silicon layer;

a metal back contact forming a metal mushroom layer coupled to a second side of the intrinsic amorphous silicon layer the metal back contact including a bottom conducting segment, two upright conducting segments, a first end of each upright conducting segment coupled to a corresponding end of the bottom conducting segment, each upright conducting segment oriented approximately perpendicular to the bottom conducting segment, at least one extension segment coupled to a second end of an upright conducting segment; and a doped amorphous silicon layer between the metal mushroom layer and the intrinsic amorphous silicon layer such that an area of the doped amorphous silicon layer is larger than an area of the metal back contact, the doped amorphous silicon layer prevents all direct contact between the intrinsic amorphous silicon layer and the metal back contact.

2. The sensor of claim 1 wherein the doped amorphous silicon layer is doped with N type material.

3. The sensor of claim 1 wherein an overhang area of doper amorphous silicon seals an end of the extension segment.

4. The sensor of claim 1 further comprising:

a passivation layer separating the metal back contact from an adjacent metal back contact.

5. The sensor of claim 1 further comprising a TFT transistor that couples to the metal back contact.

* * * * *

UNITED STATES PATENT AND TRADEMARK OFFICE
CERTIFICATE OF CORRECTION

PATENT NO. : 6,300,648 B1
DATED : October 9, 2001
INVENTOR(S) : Ping Mei et al.

It is certified that error appears in the above-identified patent and that said Letters Patent is hereby corrected as shown below:

Column 1,
Line 4, insert -- This invention was made with Government support under Agreement No. 70NANB7H3007 awarded by NIST. The United States Government has certain rights in this invention. --.

Signed and Sealed this

Thirtieth Day of May, 2006

JON W. DUDAS
*Director of the United States Patent and Trademark Office*